(12) United States Patent
Chen et al.

(10) Patent No.: US 9,299,893 B2
(45) Date of Patent: Mar. 29, 2016

(54) LIGHT-EMITTING DEVICE THAT PROVIDES EFFICIENT AND BRIGHT LUMINESCENCE

(71) Applicant: Epistar Corporation, Hsinchu (TW)

(72) Inventors: Hong-Che Chen, Hsinchu (TW);
Chien-Fu Shen, Hsinchu (TW);
Chao-Hsing Chen, Hsinchu (TW);
Yu-Chen Yang, Hsinchu (TW);
Jia-Kuen Wang, Hsinchu (TW);
Chih-Nan Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 108 days.

(21) Appl. No.: 14/150,418

(22) Filed: Jan. 8, 2014

(65) Prior Publication Data

US 2014/0191277 A1   Jul. 10, 2014

(30) Foreign Application Priority Data

Jan. 10, 2013 (CN) .................................. 102101041

(51) Int. Cl.
*H01L 33/38* (2010.01)
*H01L 33/48* (2010.01)
H01L 33/20 (2010.01)
H01L 33/40 (2010.01)

(52) U.S. Cl.
CPC ................. *H01L 33/48* (2013.01); *H01L 33/38* (2013.01); *H01L 33/20* (2013.01); *H01L 33/405* (2013.01); *H01L 2224/48091* (2013.01); *H01L 2224/48247* (2013.01); *H01L 2924/12044* (2013.01)

(58) Field of Classification Search
CPC .................................. H01L 33/38; H01L 33/48
See application file for complete search history.

(56) References Cited

U.S. PATENT DOCUMENTS

| | | | |
|---|---|---|---|
| 2008/0185606 A1* | 8/2008 | Sano et al. | 257/98 |
| 2010/0032701 A1* | 2/2010 | Fudeta | 257/98 |
| 2010/0072487 A1* | 3/2010 | Tsai et al. | 257/86 |
| 2010/0163895 A1* | 7/2010 | Horie | 257/98 |

* cited by examiner

*Primary Examiner* — Thanh V Pham
(74) *Attorney, Agent, or Firm* — Ditthavong & Steiner, P.C.

(57) ABSTRACT

A light-emitting device comprises: a light-emitting semiconductor stack comprising a recess and a mesa, wherein the recess comprises a bottom and the mesa comprises an upper surface; a first insulating layer in the recess and on a part of the upper surface of the mesa; and a first electrode comprising a first layer and a second layer, wherein the first layer comprises a first conductive material and is on another part of the upper surface of the mesa, and the second layer comprises a second conductive material and is on the first layer.

19 Claims, 15 Drawing Sheets

US 9,299,893 B2

LIGHT-EMITTING DEVICE THAT PROVIDES EFFICIENT AND BRIGHT LUMINESCENCE

REFERENCE TO RELATED APPLICATION

This application claims the right of priority based on TW application Serial No. 102101041, filed on Jan. 10, 2013, and the content of which is hereby incorporated by reference in its entirety.

TECHNICAL FIELD

The present application relates to a light-emitting device and a manufacturing method of the same, and particularly to a light-emitting device comprising an electrode comprising a first layer and a second layer, and to a manufacturing method of the same.

DESCRIPTION OF BACKGROUND ART

Light-emitting diodes (LEDs) are widely used as light sources in semiconductor devices. Compared to conventional incandescent light lamps or fluorescent light tubes, light-emitting diodes have advantages such as lower power consumption and longer lifetime, and therefore they gradually replace the conventional light sources and are applied to various fields such as traffic lights, back light modules, street lighting, and medical equipment.

As the demand for the brightness of light-emitting diodes is getting higher as the applications and developments evolve, it is a common goal for LED industry to make efforts to increase luminescence efficiency and brightness.

FIG. 9 shows a conventional LED package 30 comprising an encapsulation 31; a semiconductor LED chip 32 encapsulated in the encapsulation 31, wherein the semiconductor LED chip 32 comprises a p-n junction 33, and the encapsulation 31 is usually made of thermosetting material, such as epoxy, or thermoplastic material. The semiconductor LED chip 32 is connected to two conductive frames 35, 36 by a wire 34. The epoxy-encapsulated LED can only work in a low temperature environment since degradation of epoxy can occur at high temperature. Besides, epoxy has high thermal resistance, providing the semiconductor LED chip 32, as shown in FIG. 9, a high resistance to heat dissipation, and thus the conventional LED package 300 is limited to work at low power levels.

SUMMARY OF THE DISCLOSURE

A light-emitting device comprises: a light-emitting semiconductor stack comprising a recess and a mesa, wherein the recess comprises a bottom, and the mesa comprises an upper surface; a first insulating layer in the recess and on a part of the upper surface of the mesa; a first electrode comprising a first layer and a second layer, wherein the first layer comprises a first conductive material and is on another part of the upper surface of the mesa, and the second layer comprises a second conductive material and is on the first layer.

A light-emitting device comprises: a first electrode comprising a first layer and a second layer, wherein a first conductive material of the first layer is different from a second conductive material of the second layer, and a reflectivity of the first layer of the first electrode to a light generated by the light-emitting device is larger than a reflectivity of the second layer of the first electrode to the light, and the reflectivity of the second layer is larger than 60%.

DETAILED DESCRIPTION OF PREFERRED EMBODIMENTS

Figure 1A:
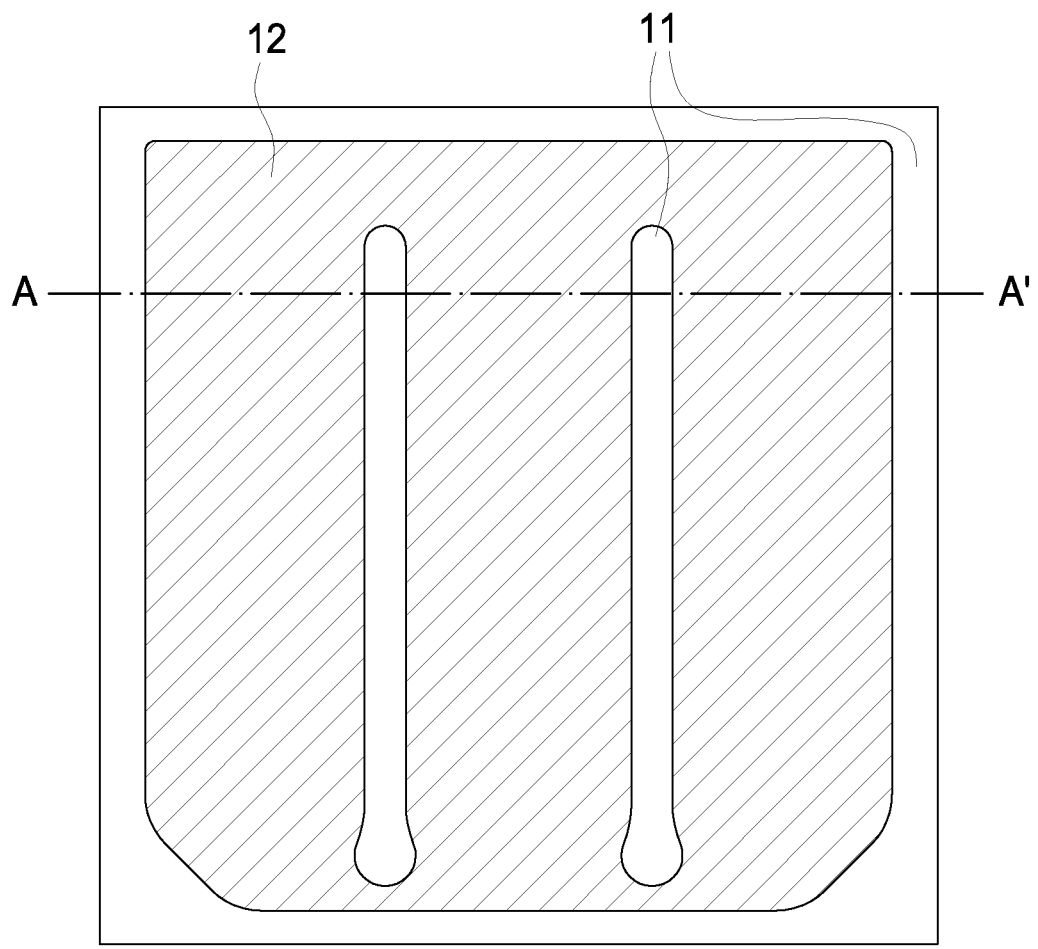
FIG. 1A is a top view of a light-emitting device during a manufacturing process in accordance with the first embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

FIGS. 1A to 8 illustrate cross-sectional views of a light-emitting device during a manufacturing process in accordance with the first embodiment of the present application.

Figure 1B:
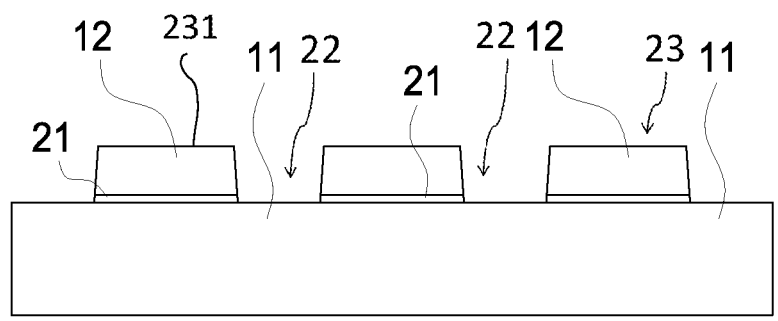
FIG. 1B is a cross-sectional diagram along the cross section line of A-A' in accordance with the light-emitting device during a manufacturing process of the present application shown in FIG. 1A.
Figure 2A:
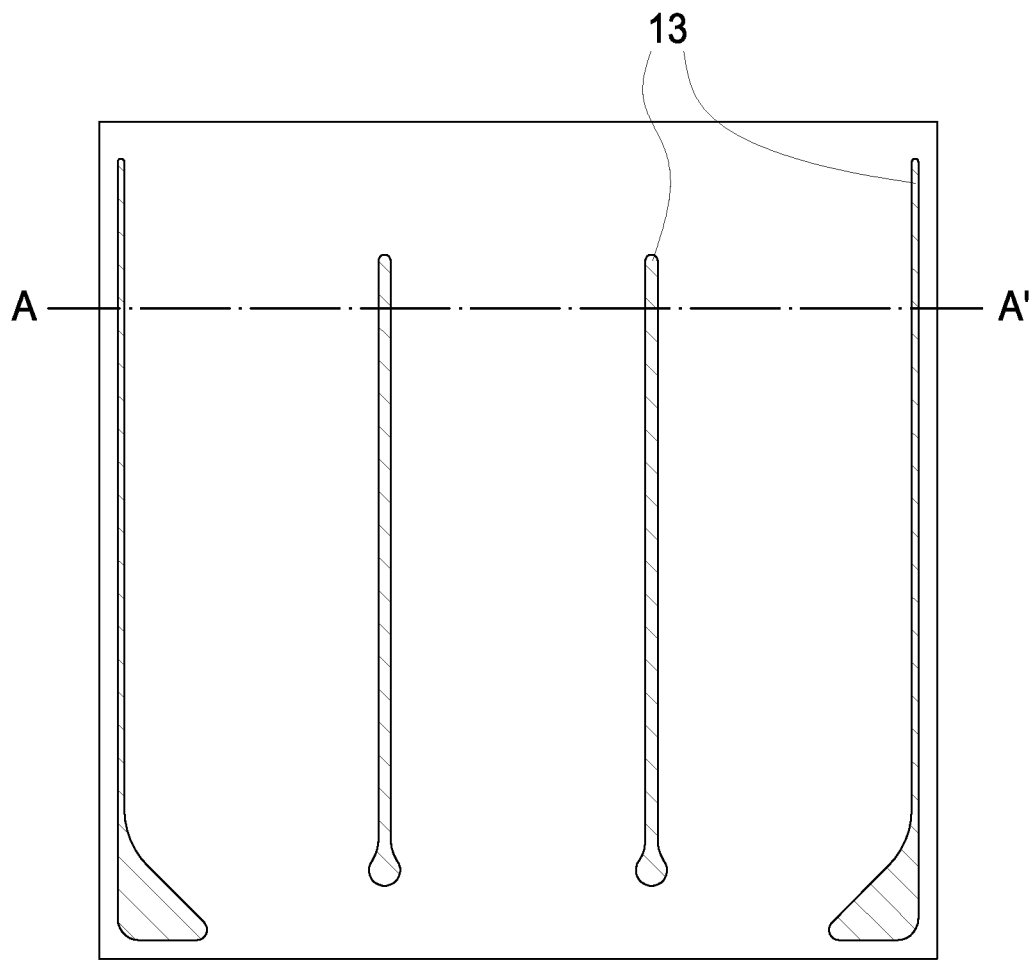
FIG. 2A is a top view of a light-emitting device during a manufacturing process in accordance with the first embodiment of the present application.
Figure 2B:
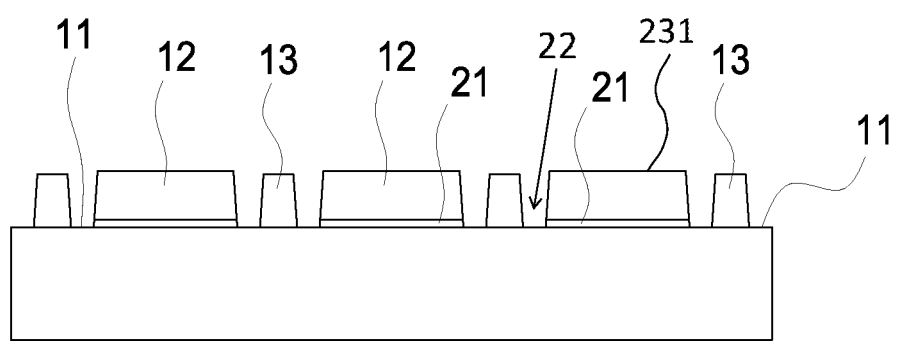
FIG. 2B is a cross-sectional diagram along the cross section line of A-A' in accordance with the light-emitting device during a manufacturing process of the present application shown in FIG. 2A.

FIG. 1A is a top view of a light-emitting device in accordance with one of the embodiments of the present application. A light-emitting device comprises a substrate (not shown) and a light-emitting semiconductor stack comprising a first conductive type semiconductor layer 11, an active layer (not shown) on the first conductive type semiconductor layer 11, and a second conductive type semiconductor layer 12 on the active layer. A part of the second conductive type semiconductor layer 12 and a part of the active layer are etched to expose the first conductive type semiconductor layer 11. FIG. 1B is a cross-sectional diagram along the cross section line of A-A' in accordance with the light-emitting device of the present application shown in FIG. 1A. The light-emitting device further comprises one recess 22 and a mesa 23, in the present embodiment, the light-emitting device comprises a plurality of recesses 22, wherein each recess 22 comprises a bottom and the mesa 23 comprises an upper surface 231. In the present embodiment, the upper surface 231 of the mesa 23 is a surface of the second conductive type semiconductor layer 12. The bottom of each recess 22 exposes the first conductive type semiconductor layer 11 and penetrates through the active layer 21. After completing the light-emitting device, a voltage is applied to the light-emitting device so as to enable the first conductive type semiconductor layer 11 to provide electrons and enable the second conductive type semiconductor layer 12 to provide holes, and then light emits from the active layer 21 by the recombination of electrons and the holes. Referring to FIG. 2A and FIG. 2B, a second electrode 13 is formed at the bottom of each recess 22 and on the first conductive type semiconductor layer 11, and the second electrode 13 is electrically connected to the first conductive type semiconductor layer 11.

Figure 3A:
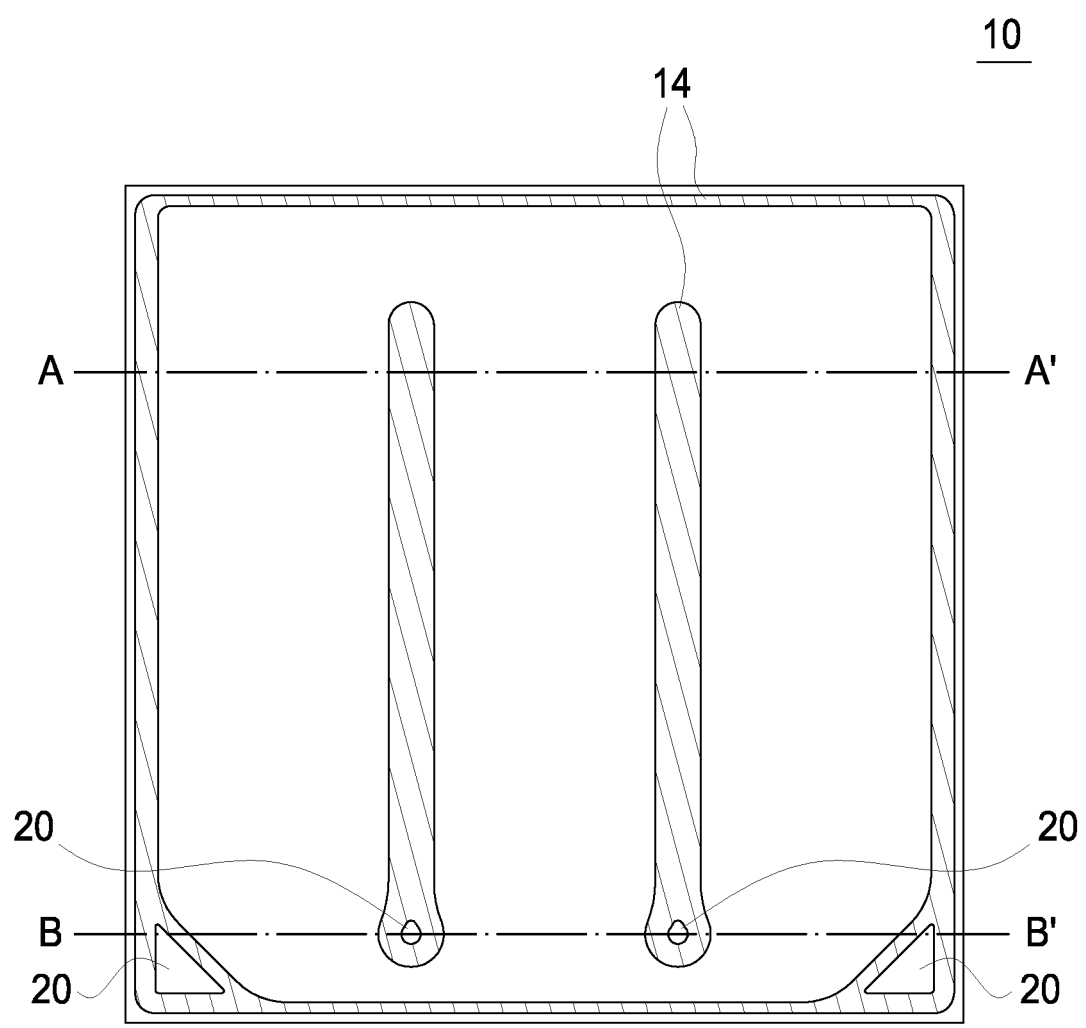
FIG. 3A is a top view of a light-emitting device during a manufacturing process in accordance with the first embodiment of the present application.

Referring to FIG. 3A, the cross section areas along the cross section line of A-A' and along the cross section line of B-B' are different in structures and processes, and thus the two cross section areas are described separately hereinafter.

Figure 3B:
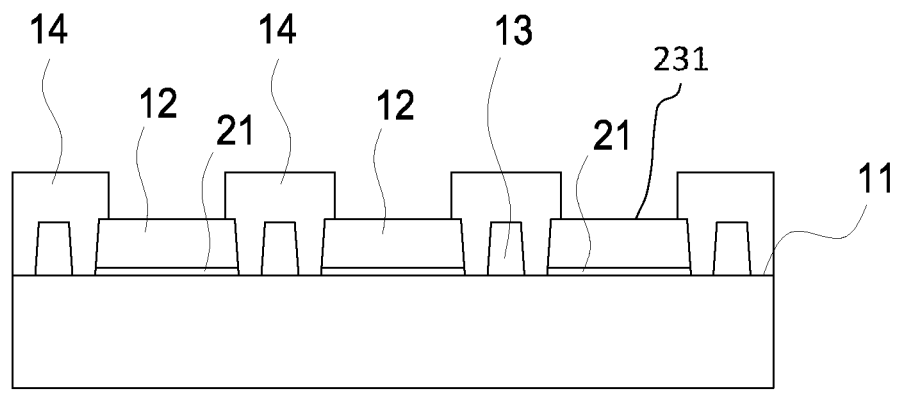
FIG. 3B is a cross-sectional diagram along the cross section line of A-A' in accordance with the light-emitting device during a manufacturing process of the present application shown in FIG. 3A.

Referring to FIG. 3B, a cross-sectional diagram along the cross section line of A-A' shown in FIG. 3A, a first insulating layer 14 is formed in each recess 22 and on a part of the upper surface 231 of the mesa 23, and the first insulating layer 14 covers the second electrode 13.

Figure 4A:
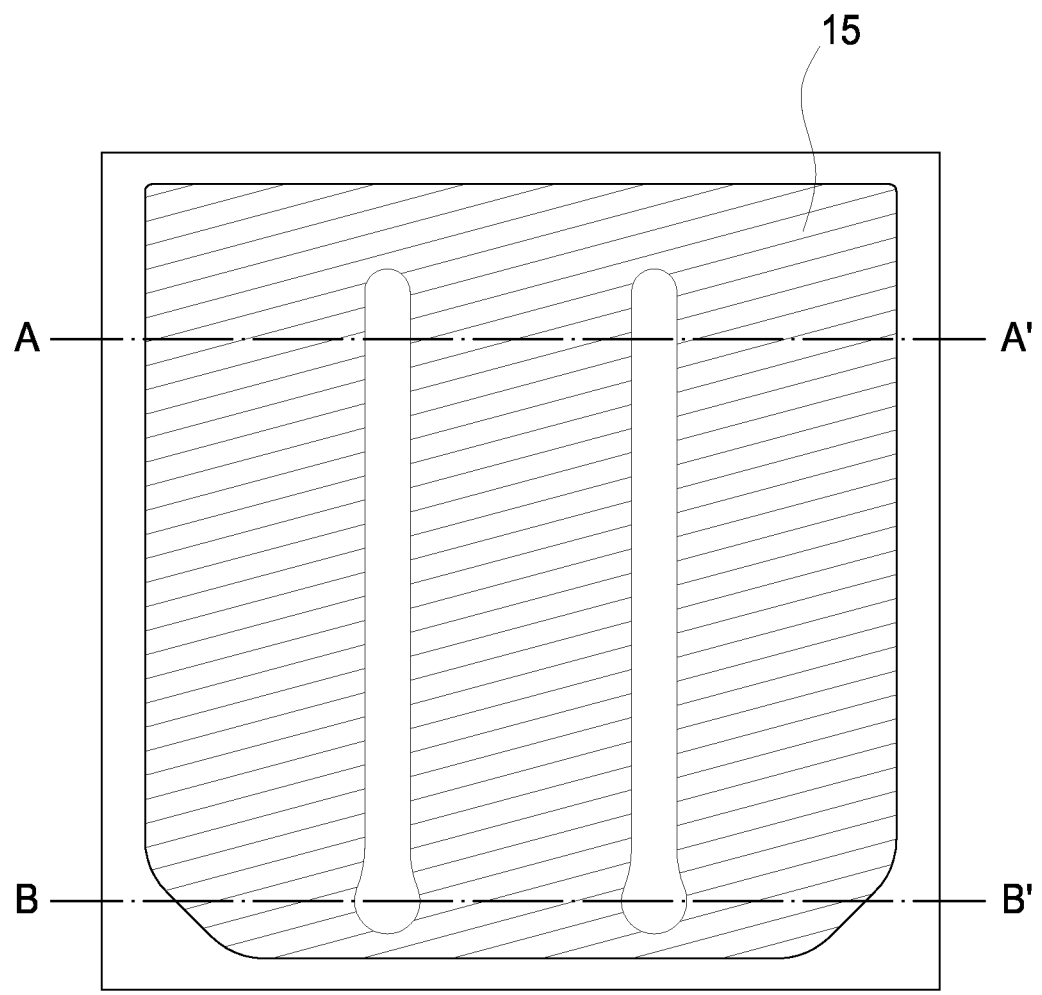
FIG. 4A is a top view of a light-emitting device during a manufacturing process in accordance with the first embodiment of the present application.
Figure 4B:
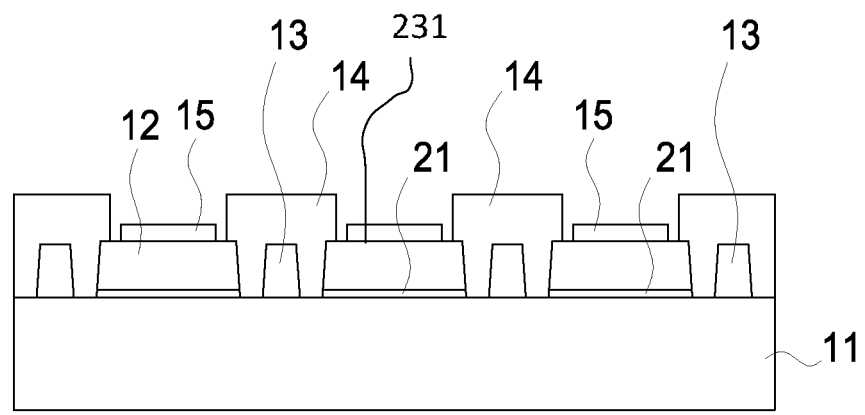
FIG. 4B is a cross-sectional diagram along the cross section line of A-A' in accordance with the light-emitting device during a manufacturing process of the present application shown in FIG. 4A.
Figure 5A:
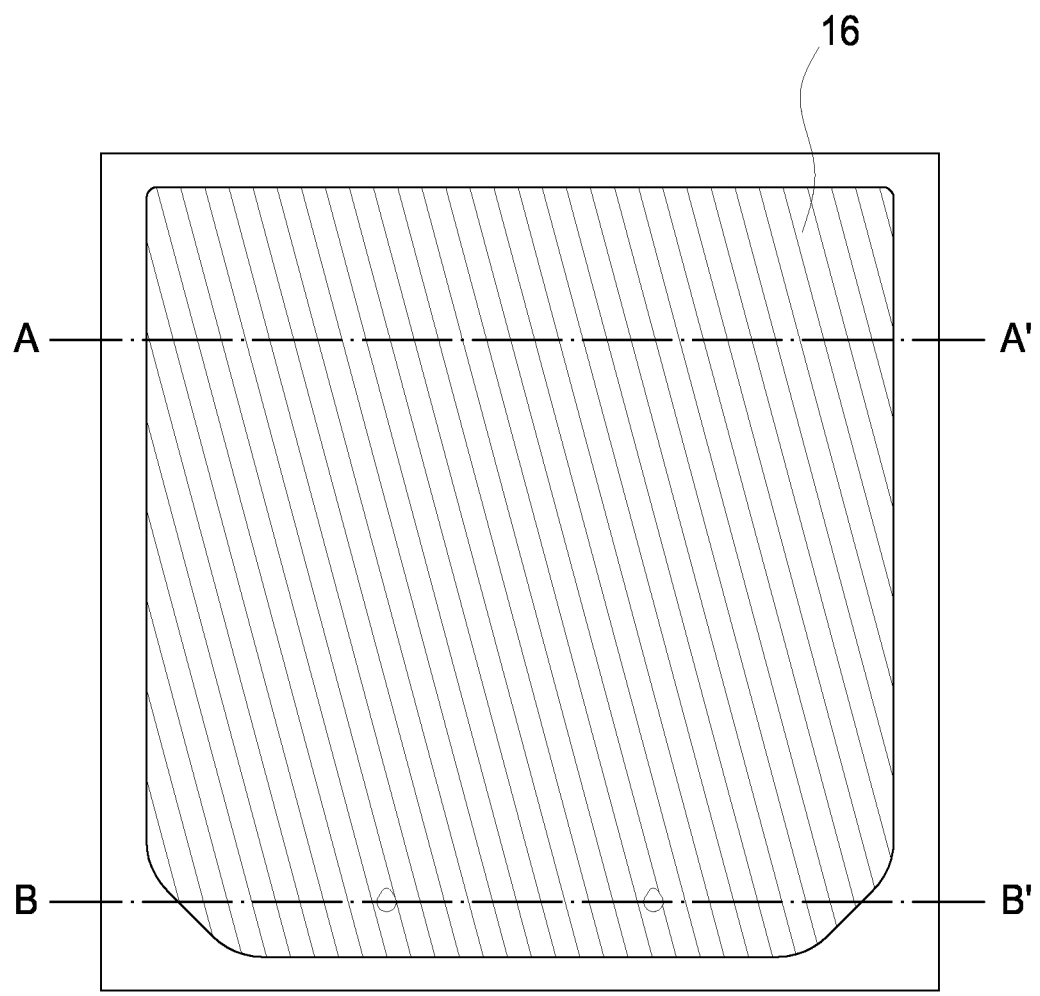
FIG. 5A is a top view of a light-emitting device in accordance with the first embodiment during a manufacturing process of the present application.
Figure 5B:
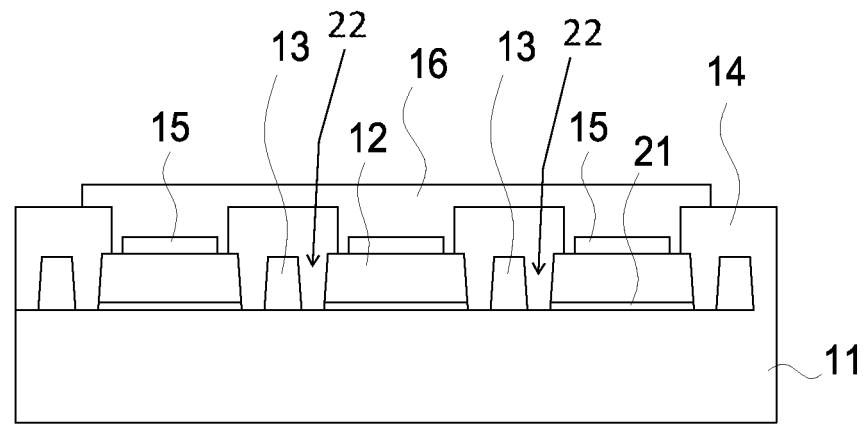
FIG. 5B is a cross-sectional diagram along the cross section line of A-A' in accordance with the light-emitting device during a manufacturing process of the present application shown in FIG. 5A.

Referring to FIG. 4A and FIG. 4B, a first layer 15 of a first electrode is then formed on another part of the upper surface 231 of the mesa 23, and the first layer 15 is spatially separated from the first insulating layer 14. Accordingly, the first insulating layer 14 is exposed. In the present embodiment, the first layer 15 of the first electrode comprises a first conductive material comprising metal. Specifically, the first conductive material comprises a material comprising an element selected from the group consisting of Ag, Pt, and Au. The thickness of the first layer 15 of the first electrode ranges from 500 to 5000 Å. Referring to FIG. 5A and FIG. 5B, a second layer 16 of the first electrode is formed on the first layer 15, and the second layer 16 of the first electrode covers the first layer 15 and at least a part of the first insulating layer 14, and thus the second layer 16 covers recesses 22. In the present embodiment, the second layer 16 of the first electrode comprises a second conductive material comprising metal. Specifically, the second conductive material comprises a material comprising an element selected from the group consisting of Ni, Al, Cu, Cr, and Ti. The thickness of the second layer 16 of the first electrode ranges from 2000 Å to 1.5 µm. In another embodiment, the first conductive material of the first layer 15 is different from the second conductive material of the second layer 16. Furthermore, a reflectivity of the first layer 15 of the first electrode to a light generated by the light-emitting device is larger than a reflectivity of the second layer 16 of the first electrode to the light. Specifically, the reflectivity to the light of the second layer is larger than 60%.

Figure 6A:
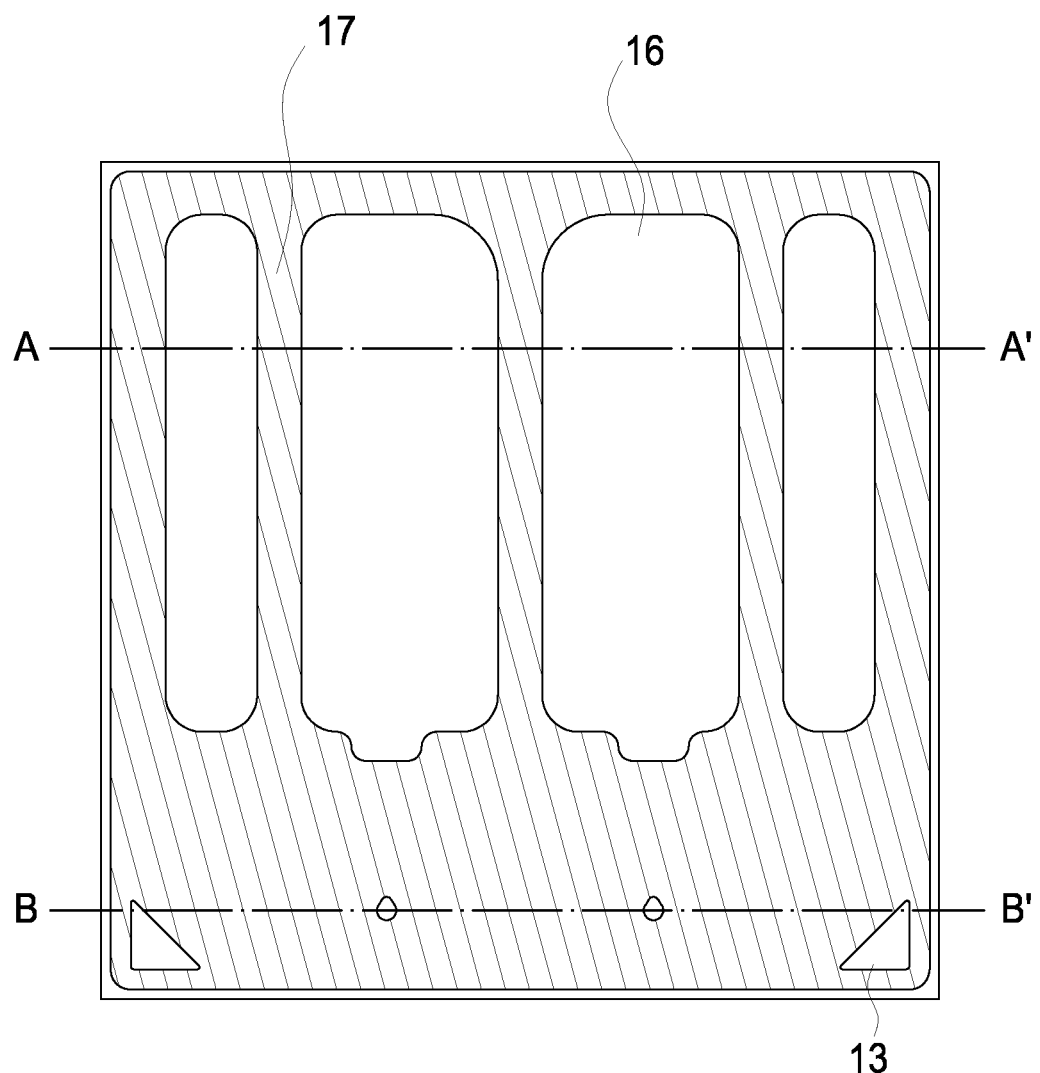
FIG. 6A is a top view of a light-emitting device during a manufacturing process in accordance with the first embodiment of the present application.
Figure 6B:
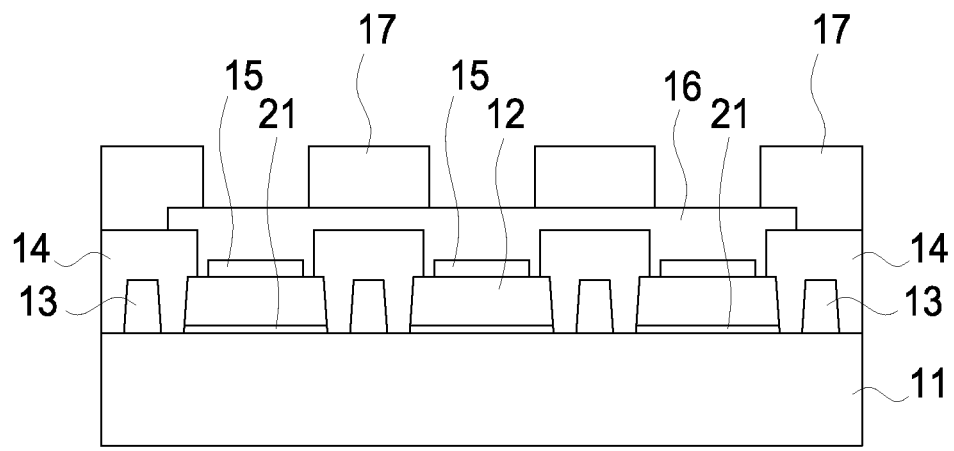
FIG. 6B is a cross-sectional diagram along the cross section line of A-A' in accordance with the light-emitting device during a manufacturing process of the present application shown in FIG. 6A.
Figure 7A:
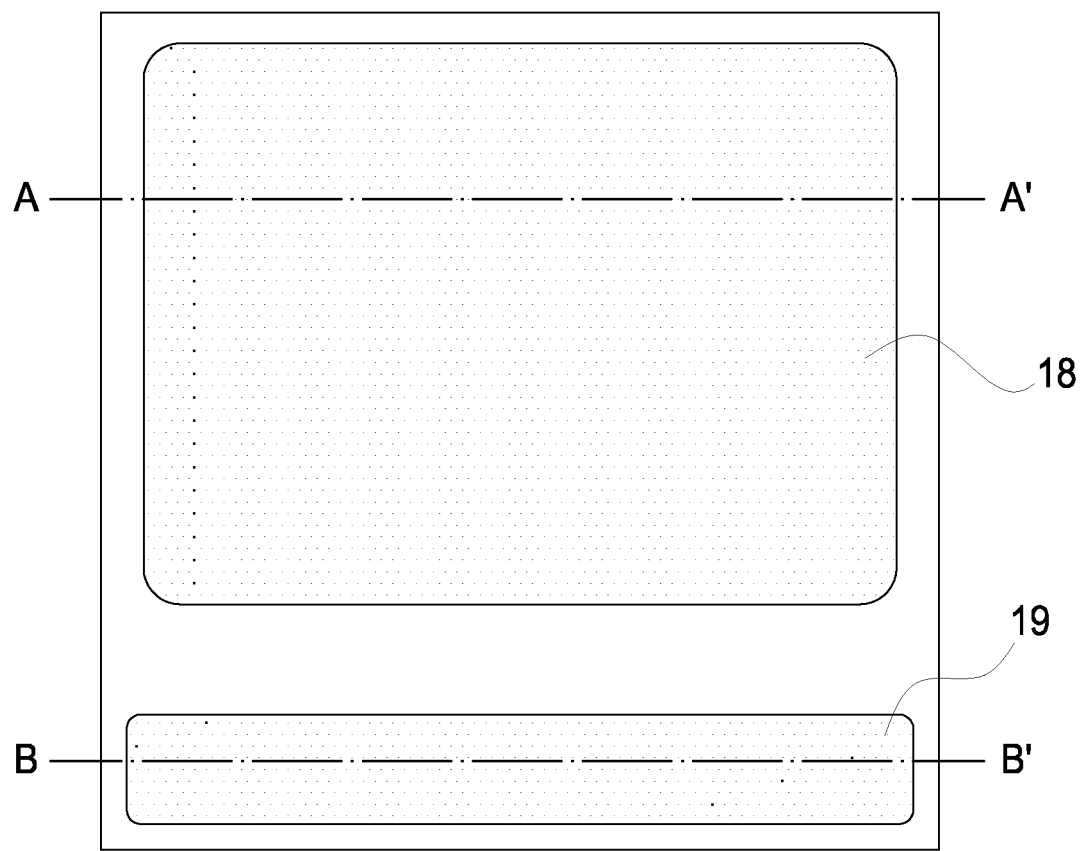
FIG. 7A is a top view of a light-emitting device during a manufacturing process in accordance with the first embodiment of the present application.
Figure 7B:
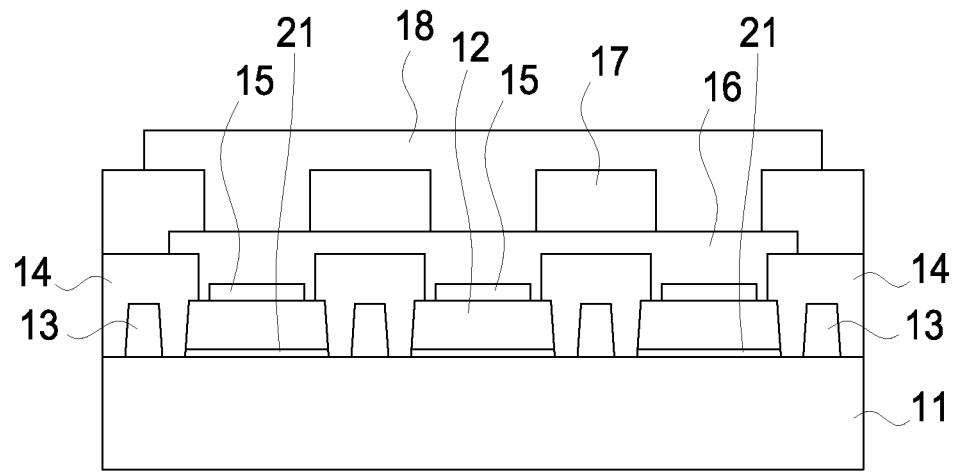
FIG. 7B is a cross-sectional diagram along the cross section line of A-A' in accordance with the light-emitting device during a manufacturing process of the present application shown in FIG. 7A.

Referring to FIG. 6A and FIG. 6B, a second insulating layer 17 is formed on the second layer 16 of the first electrode. Furthermore, a plurality of spaces is formed by the second insulating layer 17 so as to expose an upper surface of the second layer 16 of the first electrode, wherein the plurality of spaces is separated from one another. Furthermore, the second insulating layer 17 is at a position corresponding to the position of the first insulating layer 14. Specifically, the second insulating layer 17 is substantially right above the first insulating layer 14. In the present embodiment, a part of the second insulating layer 17 that is at the edge of the light-emitting device directly contacts the first insulating layer 14. A material of the first insulating layer 14 can be the same as or different from a material of the second insulating layer 17. The materials of the first insulating layer 14 and the second insulating layer 17 can be silicon oxide, silicon nitride, aluminum oxide, zirconium oxide or titanium Oxide. Referring to FIG. 7A and FIG. 7B, a first electrode pad 18 is then formed on the second insulating layer 17 and in the plurality of spaces. Furthermore, the first electrode pad 18 is electrically connected to the first layer 15 and the second layer 16 of the first electrode.

Figure 3C:
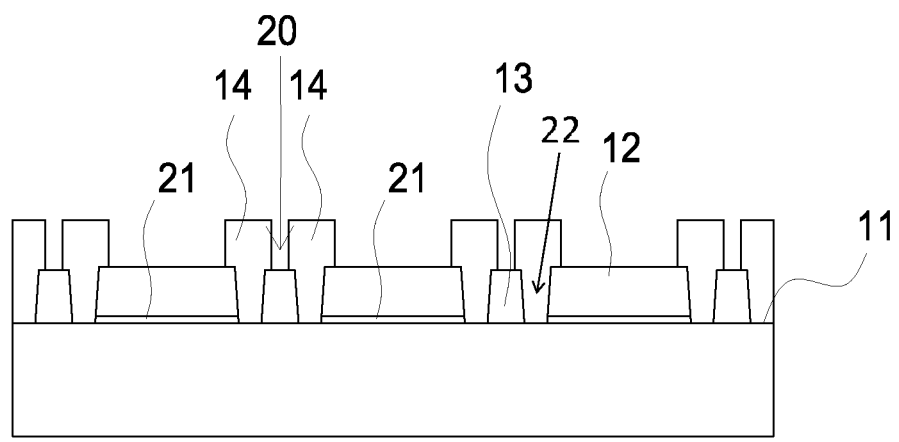
FIG. 3C is a cross-sectional diagram along the cross section line of B-B' in accordance with the light-emitting device during a manufacturing process of the present application shown in FIG. 3A.
Figure 4C:
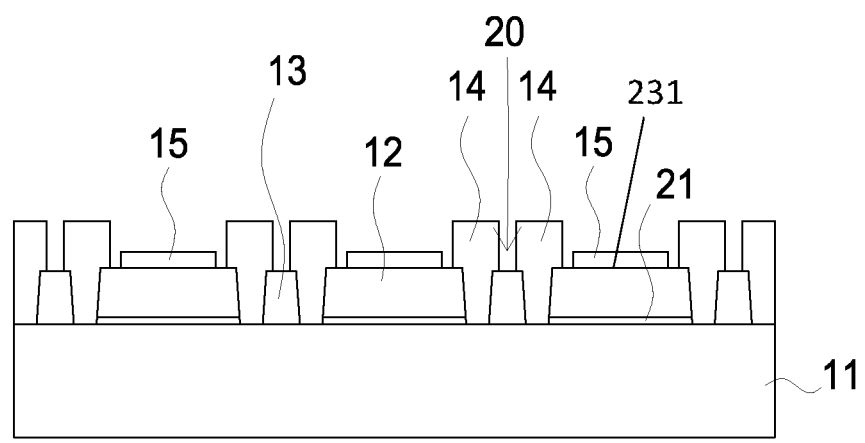
FIG. 4C is a cross-sectional diagram along the cross section line of B-B' in accordance with the light-emitting device during a manufacturing process of the present application shown in FIG. 4A.
Figure 5C:
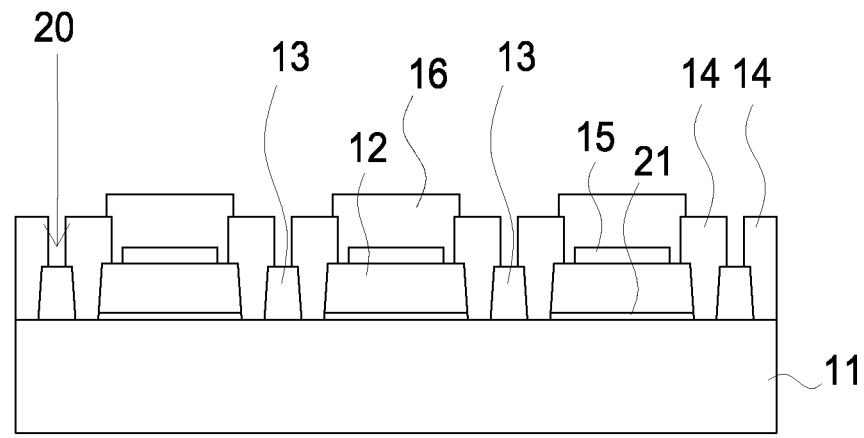
FIG. 5C is a cross-sectional diagram along the cross section line of B-B' in accordance with the light-emitting device during a manufacturing process of the present application shown in FIG. 5A.
Figure 6C:
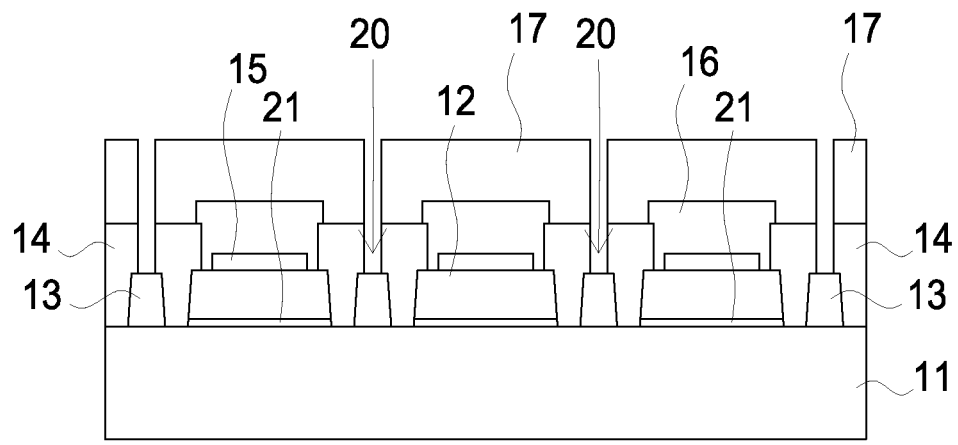
FIG. 6C is a cross-sectional diagram along the cross section lines of B-B' in accordance with the light-emitting device during a manufacturing process of the present application shown in FIG. 6A.
Figure 7C:
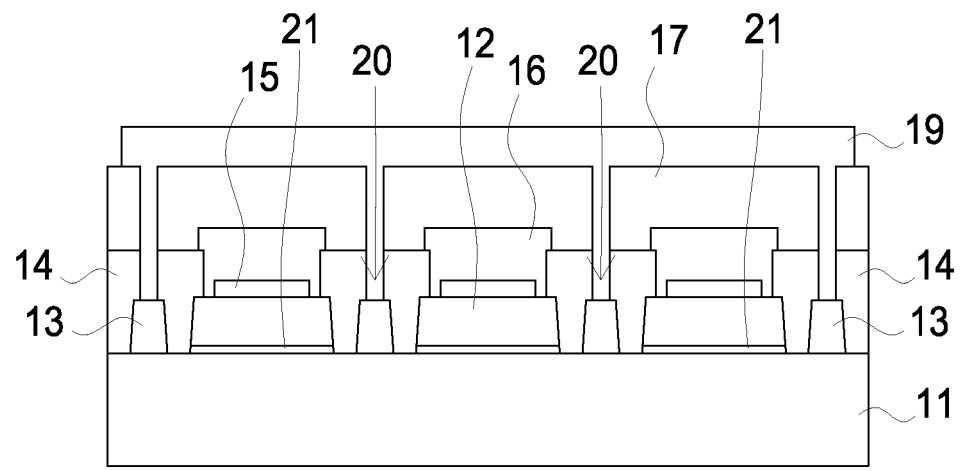
FIG. 7C is a cross-sectional diagram along the cross section line of B-B' in accordance with the light-emitting device during a manufacturing process of the present application shown in FIG. 7A.
Figure 8:
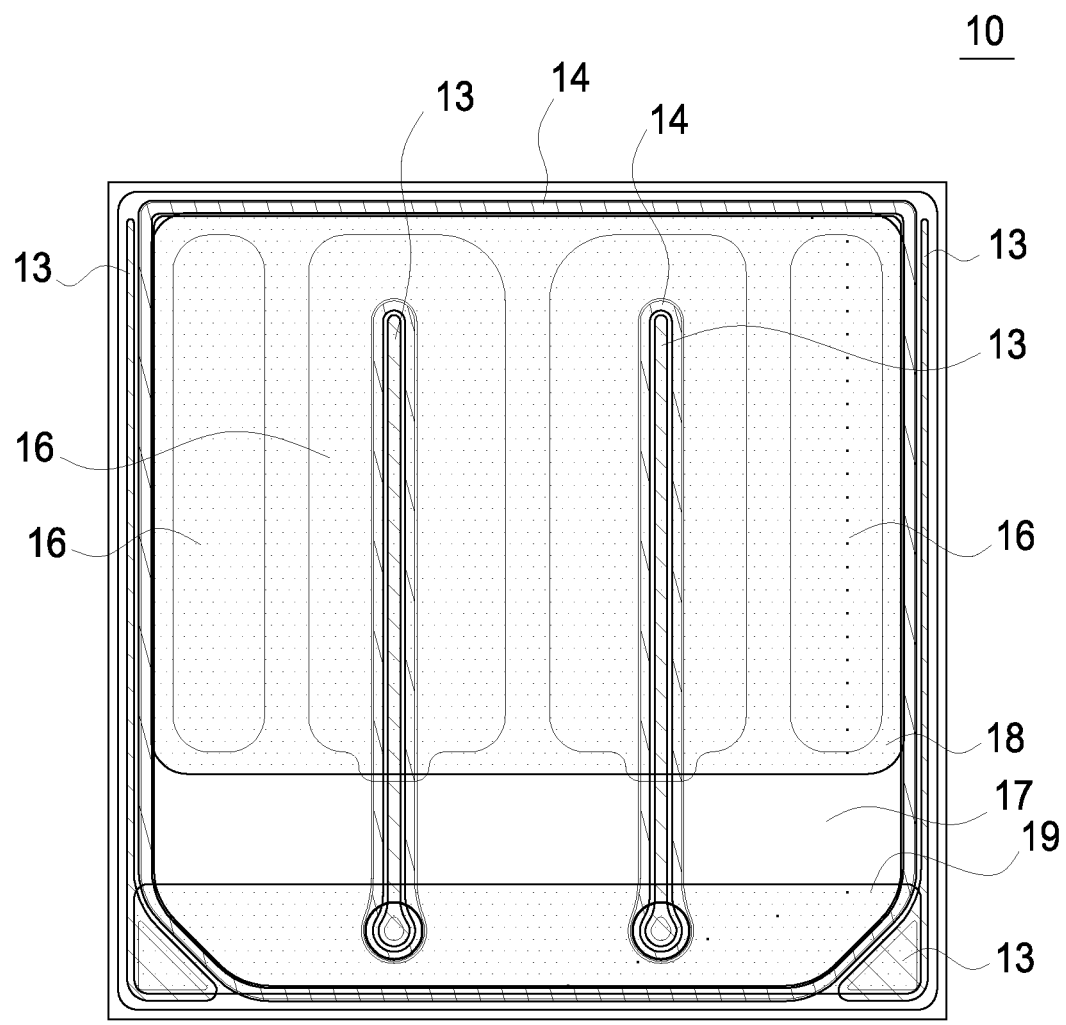
FIG. 8 is a top view of a finished light-emitting device in accordance with the first embodiment of the present application.
Figure 9:
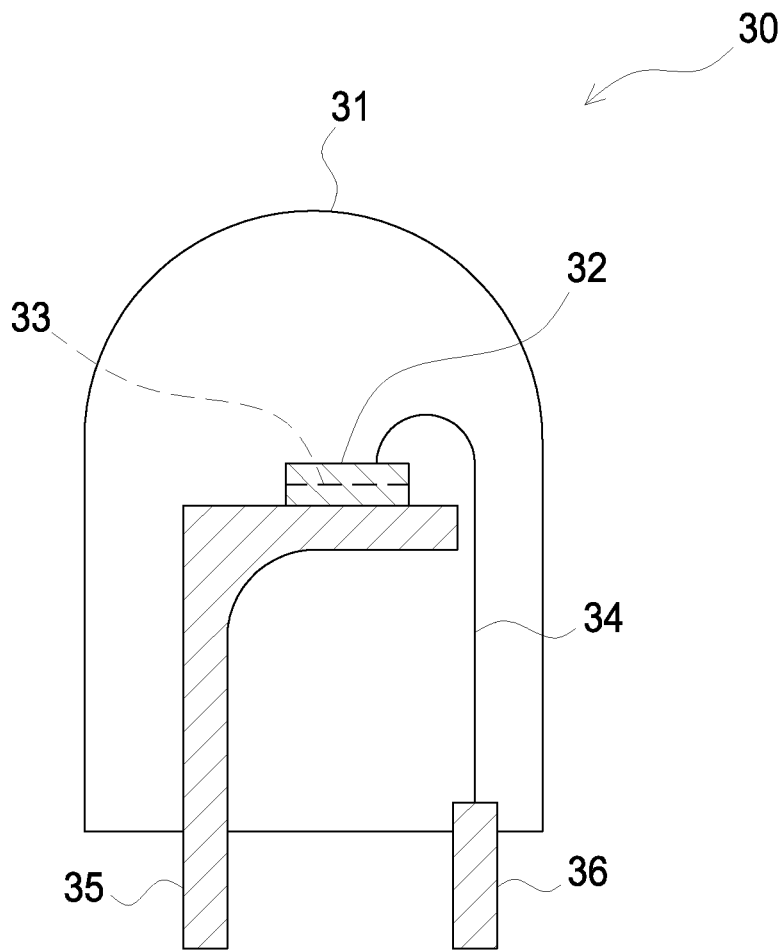
FIG. 9 illustrates a conventional LED package of a semiconductor lighting device.

Referring to FIG. 3C, a cross-sectional diagram along the cross section line of B-B' shown in FIG. 3A, the first insulating layer 14 is formed in each recess 22 and on a part of the upper surface 231 of the mesa 23. In the present embodiment, a part of an upper surface of the second electrode 13 is not covered by the first insulating layer 14, so as to form at least one passage 20 exposing the part of the upper surface of the second electrode 13. In the present embodiments, the light-emitting device comprises a plurality of passages. Referring to FIG. 4A and FIG. 4C, the first layer 15 of the first electrode is on another part of the upper surface 231 of the mesa 23, and the first layer 15 is spatially separated from the first insulating layer 14. In the present embodiment, the first layer 15 of the first electrode comprises the first conductive material comprising metal. Specifically, the first conductive material comprises a material comprising an element selected from the group consisting of Ag, Pt, and Au. The thickness of the first layer 15 of the first electrode ranges from 500 to 5000 Å. Referring to FIG. 5A and FIG. 5C, the second layer 16 of the first electrode is formed on the first layer 15, and the second layer 16 of the first electrode covers the first layer 15 and at least a part of the first insulating layer 14. In the present embodiment, the second layer 16 of the first electrode is at a position corresponding to the position of the second conductive type semiconductor layer 12 so as to expose the passages 20 exposing the part of the upper surface of the second electrode 13. The second layer 16 of the first electrode comprises the second conductive material comprising metal. Specifically, the second conductive material comprises a material comprising an element selected from the group consisting of Ni, Al, Cu, Cr, and Ti. The thickness of the second layer 16 of the first electrode ranges from 2000 Å to 1.5 µm. In another embodiment, the first conductive material of the first layer 15 is different from the second conductive material of the second layer 16. Furthermore, the reflectivity of the first layer 15 of the first electrode to the light generated by the light-emitting device is larger than the reflectivity of the second layer 16 of the first electrode to the light. Specifically, the reflectivity to the light of the second layer is larger than 60%. Referring to FIG. 6A and FIG. 6C, the second insulating layer 17 is formed on the second layer 16 of the first electrode and on the first insulating layer 14. Specifically, the second insulating layer 17 does not cover the passages 20, and thus the part of the upper surface of the second electrode 13 is still exposed by the passages 20. Furthermore, a part of the second insulating layer 17 directly contacts the first insulating layer 14. A material of the first insulating layer 14 can be the same as or different from a material of the second insulating layer 17. The materials of the first insulating layer 14 and the second insulating layer 17 can be silicon oxide, silicon nitride, aluminum oxide, zirconium oxide or titanium Oxide. Referring to FIG. 7A and FIG. 7C, a second electrode pad 19 is then formed on the second insulating layer 17 and in the passages 20. Specifically, the second electrode pad 19 directly contacts the part of the upper surface of the second electrode 13 that is not covered by the first insulating layer 14. Furthermore, the second electrode pad 19 is electrically connected to the second electrode 13. FIG. 8 is a top view of a finished light-emitting device 10 in accordance with the first embodiment of the present application.

Figure 10:
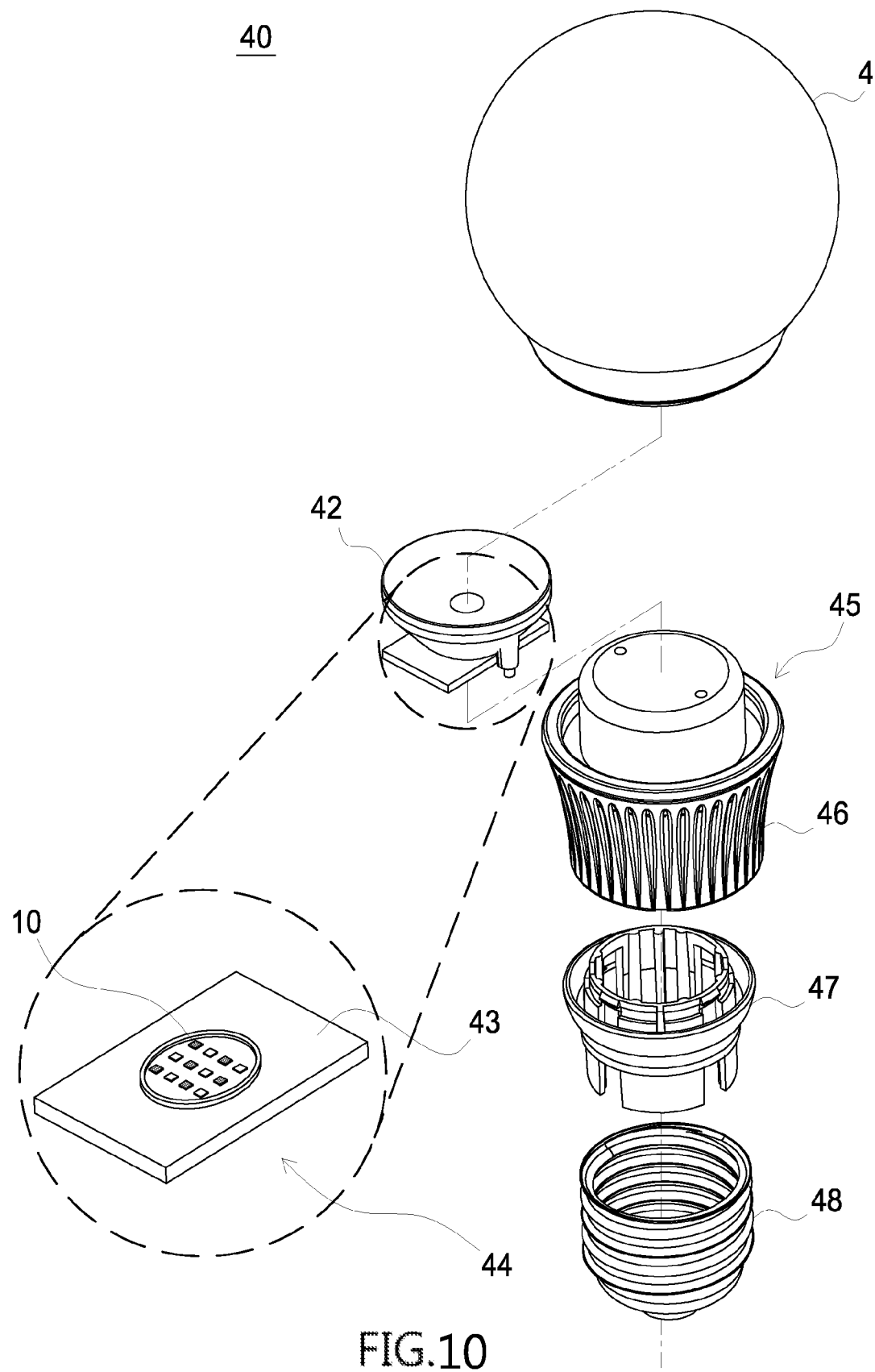
FIG. 10 is an exploded view of a light bulb in accordance with another embodiment of the present application.

FIG. 10 is an exploded view of a light bulb 40 in accordance with another embodiment of the present application. The light bulb 40 comprises a cover 41, a lens 42 disposed in the cover 41, a lighting module 44 disposed under the lens 42, a cover holder 45, a heat sink 46, a connecting part 47, and an electrical connector 48, wherein the connecting part 47 connects the cover holder 45 to the electrical connector 48. Furthermore, the lighting module 44 comprises a carrier 43 and a plurality of light-emitting devices 10 of an embodiment as mentioned above, wherein the plurality of light-emitting devices 10 is on the carrier 43.

The materials of the second electrode 13, the first electrode pad 18 and the second electrode pad 19 comprise metal such as Cr, Ti, Ni, Pt, Cu, Au, Al, W, Sn, or Ag. The substrate (not shown) is used for growing and/or a base carrier. The material of the substrate comprises transparent material comprising sapphire, $LiAlO_2$, ZnO, GaN, AlN, glass, diamond, chemical vapor deposition diamond (CVD diamond), diamond-like carbon (DLC), MgAl2O4 (spinel), silicon oxide ($SiO_x$), or $LiGaO_2$.

The first conductive type semiconductor layer 11 and the second conductive type semiconductor layer 12 as mentioned above are different in electricity, polarity or dopant, or are different in semiconductor materials used for providing electrons or holes, wherein the semiconductor materials can be a single semiconductor material layer or multiple semiconductor material layers. As used herein, "multiple" is generally defined as two or more than two. The polarity can be chosen from any two of the group consisting of p-type, n-type and i-type. The active layer 21, where the electrical energy and the light energy can be converted or stimulatively converted, is disposed between the first conductive type semiconductor layer 11 and the second conductive type semiconductor layer 12. Specifically, the active layer, where the electrical energy is converted or the light energy is induced, can be a light-emitting diode, a liquid crystal display, or an organic light-emitting diode, and the active layer, where the light energy is converted or the electrical energy is induced, can be a solar cell or a photo diode. The materials of the first conductive type semiconductor layer 11, the active layer 21 and the second conductive type semiconductor layer 12 comprise a material comprising an element selected from the group consisting of: Ga, Al, In, As, P, N, Si, and the combination thereof.

The emission spectrum of a light-emitting device of another embodiment in the present application can be adjusted by changing the physical or chemical factors of the single semiconductor material layer or the multiple semiconductor material layers. The material can be AlGaInP series, AlGaInN series, or ZnO series. The structure of the active layer (not shown) can be single heterostructure (SH), double heterostructure (DH), double-side double heterostructure (DDH) or multi-quantum well (MQW), wherein the wavelength of the light emitted from the active layer (not shown) can be changed by adjusting the number of MQW pairs.

In one of the embodiments of the present application, a buffer layer (not shown) can be optionally disposed between the first conductive type contact layer 11 and the substrate (not shown). The buffer layer is between two material systems so as to make a transition between the material system of the substrate and the material system of the semiconductor layer. For the structure of the light-emitting device, the buffer layer is used to reduce the lattice mismatch between two layers with different materials. On the other hand, the buffer layer comprises a single layer, multiple layers or a structure which comprises two materials or two separated structures. The material of the buffer layer can be organic material, inorganic material, metal or semiconductor material. The structure of the buffer layer can be a reflective layer, a thermally conductive layer, an electrically conductive layer, an ohmic contact layer, an anti-deformation layer, a stress release layer, a bonding layer, a stress adjustment layer, a wavelength conversion layer or a mechanically fixing structure. In another embodiment, the material of the buffer layer can be AlN or GaN, and the buffer layer can be formed by sputtering or atomic layer deposition (ALD).

A second conductive type contact layer (not shown) can be optionally formed on the second conductive type semiconductor layer 12. The second conductive type contact layer is disposed on a side of the second conductive type semiconductor layer 12 away from the active layer 21. More specifically, the second conductive type contact layer can be an optical layer, an electrical layer, or the combination thereof. The optical layer (not shown) can change the electromagnetic radiation or the light from or entering the active layer 21. that is, the optical layer can change at least one of the optical properties of the electromagnetic radiation or the light, wherein the optical properties comprises frequency, wavelength, intensity, flux, efficiency, color temperature, rendering index, light field and angle of view. The electrical layer can substantially change or slightly change at least value, density or distribution of the voltage, resistance, current and capacitance of any two opposite sides of the second conductive type contact layer. The material of the second conductivity type contact layer comprises oxide such as conductive oxide, transparent oxide and the oxide with a transparency not less than 50%, or comprises metal such as transparent metal and the metal with a transparency not less than 50%, or comprises organic material, inorganic material, fluoresce material, phosphor material, ceramic, undoped semiconductor material or doped semiconductor material. In some aspects, the material of the second conductivity type contact layer can be indium tin oxide, cadmium tin oxide, antimony tin oxide, indium zinc oxide, aluminum zinc oxide, or zinc tin oxide. If the material of the second conductivity type contact layer is a transparent metal, the thickness of the second conductivity type contact layer ranges from 0.005 μm to 0.6 μm.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a light-emitting semiconductor stack comprising a plurality of recesses and a mesa, wherein each of the plurality of recesses comprises a bottom, and the mesa comprises an upper surface;
   a first electrode comprising a first layer and a second layer, wherein the first layer comprises a first conductive material and is formed on the upper surface of the mesa, and the second layer comprises a second conductive material and is on the first layer;
   a plurality of second electrodes respectively formed on the bottom of each of the plurality of recesses;
   a first insulating layer formed in each of the plurality of recesses and on a part of the upper surface of the mesa, wherein the first insulating layer comprises a plurality of passages to expose the plurality of second electrodes;
   a first electrode pad formed on the first insulating layer and contacting the first electrode; and
   a second electrode pad formed on the plurality of passages to contact the plurality of second electrodes.

2. The light-emitting device according to claim 1, further comprising a substrate associated with the light-emitting semiconductor stack.

3. The light-emitting device according to claim 1, wherein the light-emitting semiconductor stack comprises a first conductive type semiconductor layer, an active layer on the first conductive type semiconductor layer, and a second conductive type semiconductor layer on the active layer, wherein the active layer emits a light and the plurality of recesses penetrates through the active layer.

4. The light-emitting device according to claim 3, wherein the bottom of the plurality of recesses exposes the first conductive type semiconductor layer, and the upper surface of the mesa is a surface of the second conductive type semiconductor layer.

5. The light-emitting device according to claim 3, wherein a reflectivity of the first layer to the light is larger than a reflectivity of the second layer to the light.

6. The light-emitting device according to claim 3, wherein a reflectivity of the second layer to the light is larger than 60%.

7. The light-emitting device according to claim 1, further comprising a second insulating layer between the first electrode and the first electrode pad.

8. The light-emitting device according to claim 7, wherein a part of the second insulating layer directly contacts the first insulating layer.

9. The light-emitting device according to claim 7, wherein the second insulating layer comprises a space to expose the second layer of the first electrode.

10. The light-emitting device according to claim 1, wherein the first conductive material is different from the second conductive material.

11. The light-emitting device according to claim 1, wherein the first conductive material and/or the second conductive material comprise metal.

12. The light-emitting device according to claim 1, wherein a thickness of the first layer ranges from 500 Å to 5000 Å and/or a thickness of the second layer ranges from 2000 Å to 1.5 μm.

13. The light-emitting device according to claim 1, wherein the first layer of the first electrode is spatially separated from the first insulating layer.

14. The light-emitting device according to claim 1, wherein the first electrode covers the plurality of recesses.

15. The light-emitting device according to claim 1, wherein the first conductive type semiconductor layer is exposed along a periphery of the light-emitting semiconductor stack from a top view of the light-emitting device.

16. The light-emitting device according to claim 15, wherein the first insulating layer covers the first conductive type semiconductor layer exposed along the periphery of the light-emitting semiconductor stack.

17. The light-emitting device according to claim 15, further comprising a second insulating layer covering the first conductive type semiconductor layer exposed along the periphery of the light-emitting semiconductor stack.

18. The light-emitting device according to claim 1, further comprising a second conductivity type contact layer formed on the second conductive type semiconductor layer, wherein the second conductivity type contact layer comprises indium tin oxide, cadmium tin oxide, antimony tin oxide, indium zinc oxide, aluminum zinc oxide, or zinc tin oxide.

19. A light-emitting device, comprising:
   a light-emitting semiconductor stack comprising a plurality of recesses and a mesa, wherein each of the plurality of recesses comprises a bottom surface, and the mesa comprises an upper surface;
   a first electrode comprising a first layer and a second layer, wherein the first layer comprises a first conductive material and the second layer comprises a second conductive material different from the first conductive material;
   a plurality of second electrodes respectively formed on the bottom surface of the plurality of recesses;
   a first insulating layer formed in each of the plurality of recesses and on a part of the upper surface of the mesa, wherein the first insulating layer comprises a plurality of passages to expose the plurality of second electrodes;
   a second insulating layer formed on the first insulating layer at a position corresponding to a position of the first insulating layer;
   a first electrode pad formed on the second insulating layer and contacting the first electrode; and a second electrode pad formed on the plurality of passages and contacting the plurality of second electrodes.

\* \* \* \* \*